(12) United States Patent
Fukui

(10) Patent No.: US 9,059,153 B2
(45) Date of Patent: Jun. 16, 2015

(54) SEMICONDUCTOR DEVICE

(75) Inventor: Takeshi Fukui, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 13/607,701

(22) Filed: Sep. 8, 2012

(65) Prior Publication Data

US 2013/0249103 A1    Sep. 26, 2013

(30) Foreign Application Priority Data

Mar. 21, 2012  (JP) ................ P2012-063680

(51) Int. Cl.
| | |
|---|---|
| *H01L 23/52* | (2006.01) |
| *H01L 23/495* | (2006.01) |
| *H01L 23/544* | (2006.01) |
| *H01L 23/31* | (2006.01) |
| *H01L 23/00* | (2006.01) |

(52) U.S. Cl.
CPC . *H01L 23/49513* (2013.01); *H01L 2224/32245* (2013.01); *H01L 2924/13055* (2013.01); *H01L 23/3107* (2013.01); *H01L 23/49524* (2013.01); *H01L 23/49541* (2013.01); *H01L 23/49548* (2013.01); *H01L 23/49562* (2013.01); *H01L 2224/40245* (2013.01); *H01L 2924/0132* (2013.01); *H01L 23/544* (2013.01); *H01L 24/29* (2013.01); *H01L 24/32* (2013.01); *H01L 24/33* (2013.01); *H01L 24/40* (2013.01); *H01L 24/41* (2013.01); *H01L 2224/29111* (2013.01); *H01L 2224/73263* (2013.01); *H01L 2924/13091* (2013.01); *H01L 2924/1305* (2013.01)

(58) Field of Classification Search
CPC ............... H01L 23/49513; H01L 23/49524; H01L 23/49562; H01L 23/544; H01L 23/32; H01L 23/33; H01L 23/40; H01L 23/41
USPC .......................................... 257/773, E23.023
See application file for complete search history.

(56) References Cited

U.S. PATENT DOCUMENTS

| | | | | |
|---|---|---|---|---|
| 6,072,228 A | * | 6/2000 | Hinkle et al. ................ | 257/666 |
| 6,307,755 B1 | * | 10/2001 | Williams et al. ............ | 361/813 |
| 6,815,729 B1 | * | 11/2004 | Brophy et al. ............... | 257/98 |
| 6,849,930 B2 | * | 2/2005 | Nakajima et al. ........... | 257/666 |
| 2007/0290336 A1 | * | 12/2007 | Sun et al. .................... | 257/735 |

(Continued)

FOREIGN PATENT DOCUMENTS

| | | |
|---|---|---|
| JP | 2004-031515 | 1/2004 |
| JP | 2007-035913 | 2/2007 |

(Continued)

*Primary Examiner* — Shaun Campbell
(74) *Attorney, Agent, or Firm* — Patterson & Sheridan, LLP

(57) ABSTRACT

A semiconductor device includes a semiconductor chip, a first electrode terminal, a second electrode terminal, and a connector. The semiconductor chip is carried on the first electrode terminal. The second electrode terminal is separated from the first electrode terminal. The connector includes first through third structural parts. The first structural part is connected to an electrode of the semiconductor chip via the first connecting part; the third structural part is connected to a second electrode terminal via the second connecting part; the second structural part connects the first and third structural parts; and holes are formed on at least one of the first through third structural parts. Additionally, laser ablated recesses may be formed in the first electrode terminal to align the semiconductor chip therewith.

13 Claims, 17 Drawing Sheets

(56) References Cited

U.S. PATENT DOCUMENTS

2009/0189264 A1 7/2009 Yato et al.
2012/0241934 A1* 9/2012 Miyake .......................... 257/676

FOREIGN PATENT DOCUMENTS

| | | |
|---|---|---|
| JP | 2008-108831 | 5/2008 |
| JP | 2009-259981 | 11/2009 |

* cited by examiner

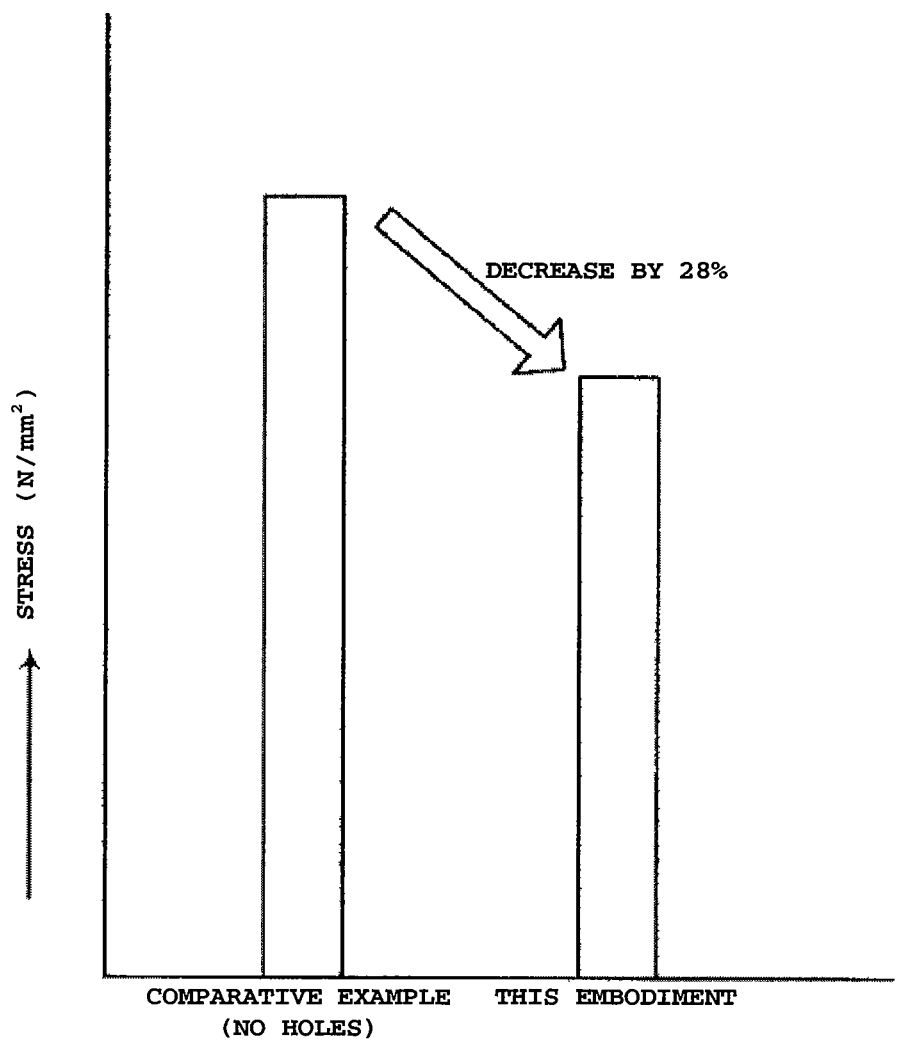

SEMICONDUCTOR DEVICE

CROSS-REFERENCE TO RELATED APPLICATION

This application is based upon and claims the benefit of priority from Japanese Patent Application No. 2012-063680, filed Mar. 21, 2012, the entire contents of which are incorporated herein by reference.

FIELD

Embodiments described herein relate to a semiconductor device.

BACKGROUND

In semiconductor devices in which the IGBT (insulated gate bipolar transistor), power MOS transistor, and other power elements are sealed, connectors for connecting the electrodes and the electrode terminals of the power elements, connectors for connecting the electrodes of a power element to the electrodes of another power element, etc. are often used. Semiconductor devices requiring such connectors are widely adopted in power applications in homes and industry. In recent years, there has been a high demand for power elements with higher current and higher voltage rating.

For the power element, in order to have a high current flow, the electrode area is increased and the connector area is made larger, but resulting internal stresses lead to degradation in the reliability of the semiconductor device. This is undesirable. Also, the yield becomes lower in the assembly operation. This is also undesired.

DESCRIPTION OF THE DRAWINGS

FIG. 5 is a diagram illustrating the stress applied to the electrodes in the first embodiment.

DETAILED DESCRIPTION

Embodiments of the present disclosure will be explained with reference to figures.

According to the embodiment, there is provided a semiconductor device having improved reliability.

The semiconductor device has a semiconductor chip, a first electrode terminal, a second electrode terminal, and a connector. The semiconductor chip is carried on the first electrode terminal. The second electrode terminal is separated from the first electrode terminal. The connector includes first through third structural parts. The first structural part is carried on the electrodes of the semiconductor chip via the first connecting part; the third structural part is carried on a second electrode terminal via the second connecting part; the second structural part connects the first and third structural parts; and holes are formed on at least one of the first through third structural parts.

Embodiment 1

Figure 1:
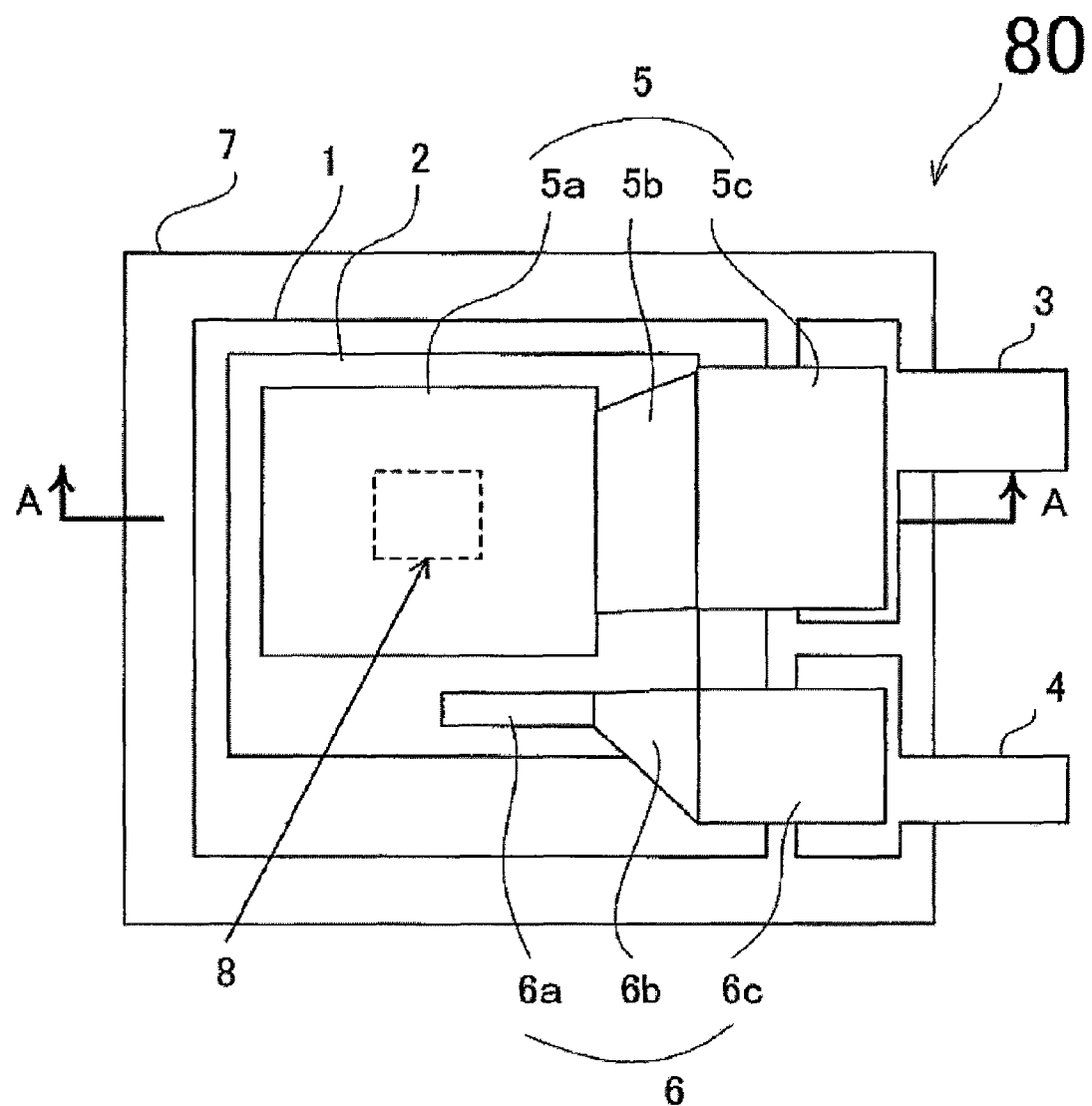
FIG. 1 is a plane view illustrating a semiconductor device according to a first embodiment.
Figure 2:
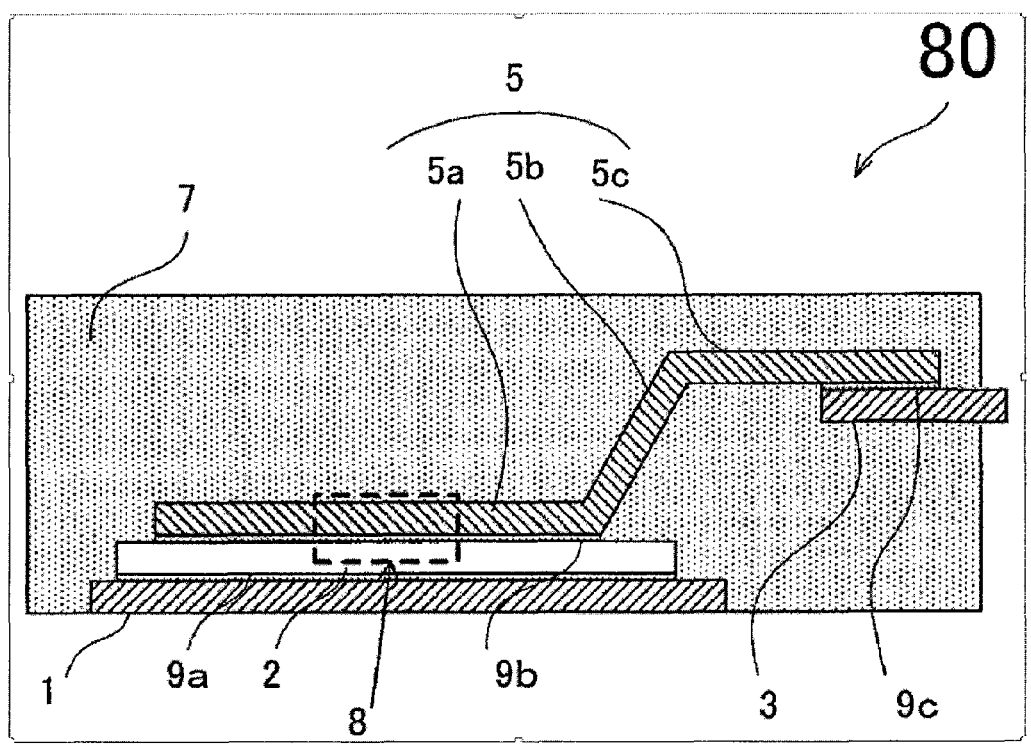
FIG. 2 is a cross-sectional view taken across A-A in FIG. 1.
Figure 3:
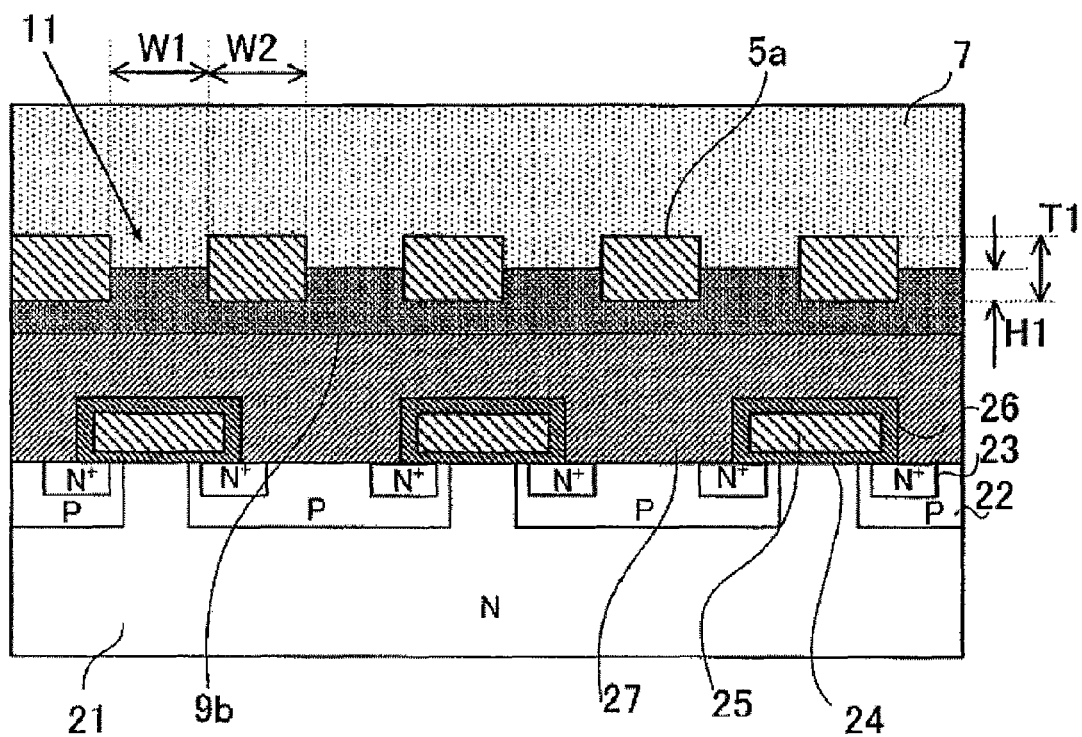
FIG. 3 is an enlarged cross-sectional view illustrating the hole forming region in the first embodiment.
Figure 4A:
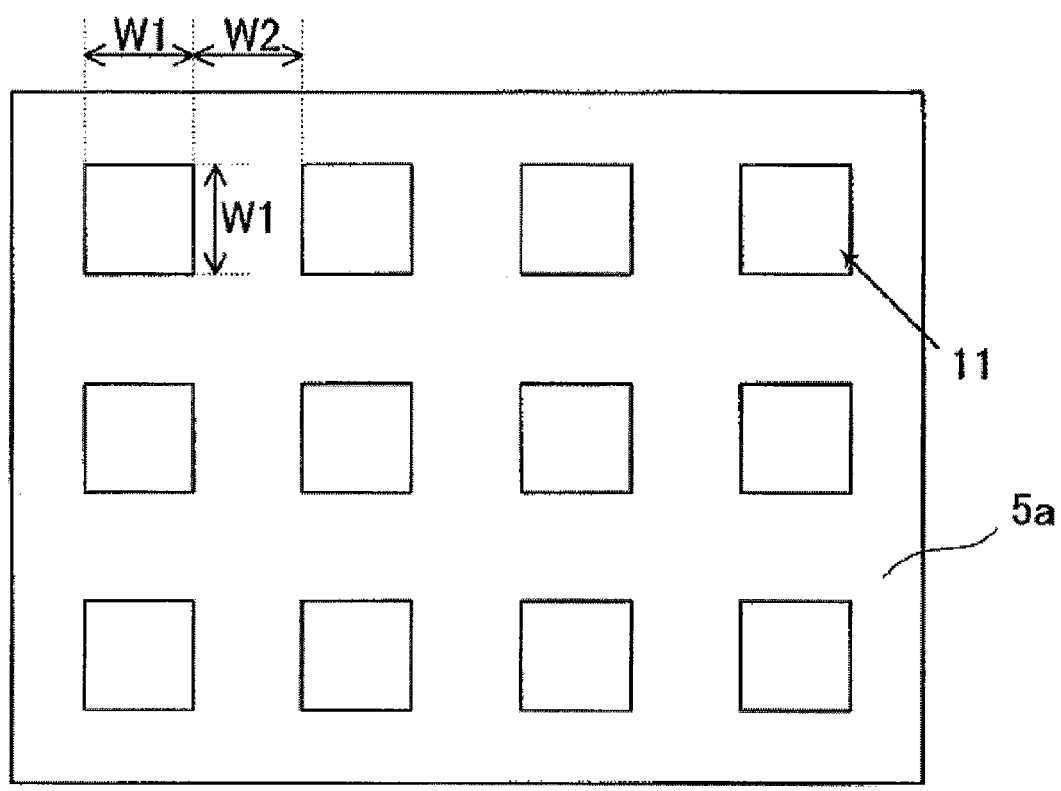
FIGS. 4A and 4B are plane views illustrating the shape of the holes in the first embodiment.
Figure 4B:
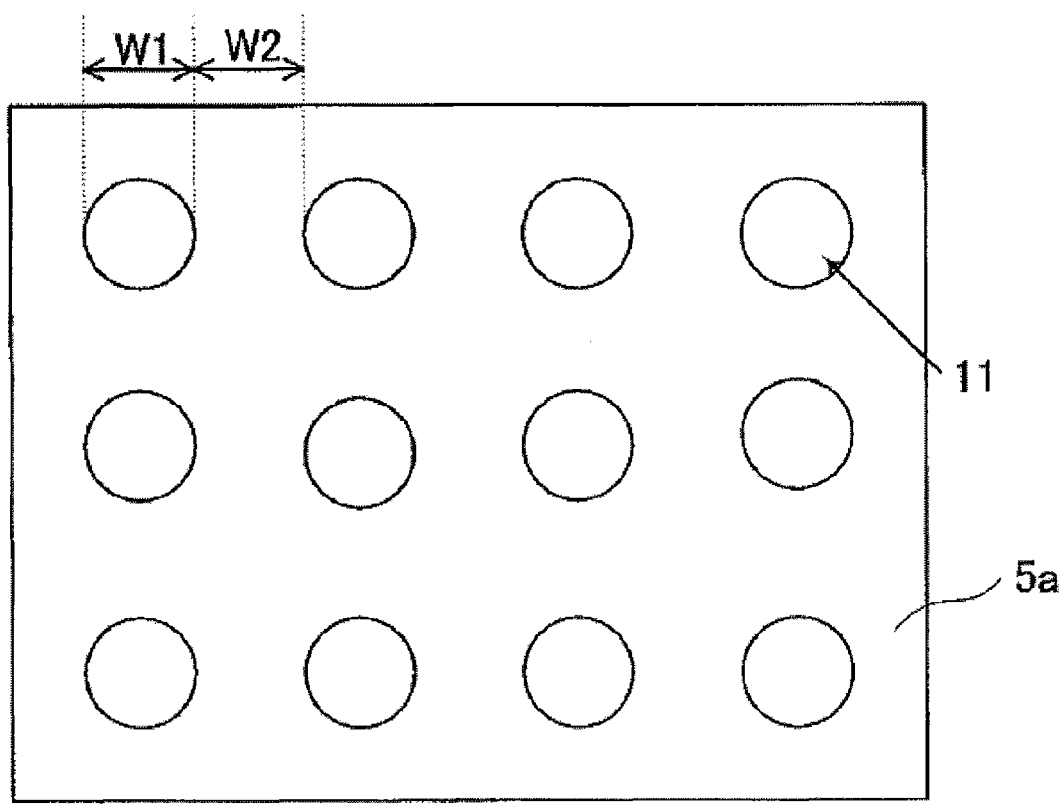

The semiconductor device related to Embodiment 1 of the present disclosure will be explained with reference to the figures. FIG. 1 is a plane view illustrating the semiconductor device. FIG. 2 is a cross-sectional view taken across A-A in FIG. 1. FIG. 3 is an enlarged cross-sectional view of a hole formed region of the device. FIGS. 4A and 4B are plane views illustrating the shape of the holes in the hole formed region. In this embodiment, holes are formed on the connector on the semiconductor chip to decrease the internal stress thereof.

As shown in FIG. 1, the semiconductor device 80 includes an electrode terminal 1, semiconductor chip 2, source electrode terminal 3, gate electrode terminal 4, connector 5, connector 6, and sealant 7. The semiconductor device 80 is a connector jointing type semiconductor device, which has the semiconductor chip 2 sealed off and has the electrode terminals and electrodes joined with each other by connectors. The semiconductor device 80 can be adopted in various fields, such as electric railways, electric automobiles, inverter field, inductive heating field, etc.

Here, the semiconductor chip 2 is an IGBT (insulated gate bipolar transistor). The drain electrode terminal 1 is the drain electrode terminal. The source electrode terminal 3 is the source electrode terminal. The gate electrode terminal 4 is the gate electrode terminal.

The semiconductor chip 2 is connected to the electrode terminal 1. The connector 5 includes structural parts 5a through 5c. Structural part 5a of the connector 5 is connected to the source electrode (not shown in the figure) of the semiconductor chip 2. The structural part 5c of the connector 5 is connected to the source electrode terminal 3. The structural part 5b of the connector 5 spans between the structural part 5a of the connector 5 and the structural part 5c of the connector 5. The connector 6 comprises structural parts 6a through 6c. The structural part 6a of the connector 6 is connected to the gate electrode (not shown in the figure) of the semiconductor chip 2. The structural part 6c of the connector 6 is connected to the gate electrode terminal 4. The structural part 6b of the connector 6 connects the structural part 6a of the connector 6 and the structural part 6c of the connector 6.

In the structural part 5a of the connector 5 on the semiconductor chip 2, a hole formed region 8 having plural holes formed in the central portion is provided. Where the hole formed region 8 is provided, the internal stress generated in the semiconductor device 80 by the attachment of the connector 5 thereto is decreased, and it is possible to increase the yield, i.e., the number of good units of device 80, of the assembly.

The electrode terminal 1, semiconductor chip 2, source electrode terminal 3, gate electrode terminal 4, connector 5, and connector 6 are sealed by a resin which is employed as the sealant 7. The end portions of the source electrode terminal 3 and gate electrode terminal 4 shown in FIG. 1 extends from the sealant 7 and are thus exposed. The connector 5, connector 6, electrode terminal 1, source electrode terminal 3, and gate electrode terminal 4 may be comprised of Cu (copper). However, they may also be made of nickel (Ni) plated copper (Cu), silver (Ag) plated copper (Cu), gold (Au) plated copper (Cu), copper alloy, aluminum (Al), etc. Also, the sealant 7 may be made of epoxy resin. However, it may also be made of a silicone sealant or the like.

The semiconductor chip 2 is an IGBT designed to have the area of the source electrode larger than that of the gate electrode. In order to ensure the connector contacts the source electrode over a large area, the structural part 5a of the connector 5 is selected to have an area larger than that of the structural part 6a of the connector 6.

As shown in FIG. 2, the semiconductor chip 2 is arranged via a joining layer 9a on the first principal surface (outer surface) of the electrode terminal 1. The joining layer 9a joins the drain electrode terminal 1 and the semiconductor chip 2 with each other. The second principal surface (back surface) opposite the first principal surface of the drain electrode terminal 1 is exposed. The structural part 5a of the connector 5 is arranged via a joining layer 9b on the first principal surface (outer surface) of the semiconductor chip 2. The joining layer 9b joins the semiconductor chip 2 and the structural part 5a of the connector 5. The joining layer 9c joins the source electrode terminal 3 and the structural part 5c of the connector 5 with each other.

The joining layers 9a through 9c are made of Pb (lead)-free solder (such as Sn (tin)-Ag (silver)-Cu (copper)). Alternatively, instead of the Sn (tin)-Ag (silver)-Cu (copper) type solder, one may also use the following types of solders: Sn (tin)-Cu (copper) type solders, Sn (tin)-Zn (zinc) type solders, Sn (tin)-Bi (bismuth) type solders, Sn (tin)-37 Pb (lead) solder, etc as the joining layers 9a-c.

As shown in FIG. 3, in the semiconductor device 80 at the hole formed region 8, a P layer 22 is arranged on the first principal surface (outer surface) of the N layer 21 of the semiconductor chip 2 as an IGBT. On the first principal surface (outer surface) of the P layer 22, an N+ source layer 23 is arranged. On the side of the second principal surface (back surface) of the N layer 21 opposite the first principal surface (outer surface), the following layers (not shown in the figure) are arranged: N+ buffer layer, P+ drain layer, drain electrode, etc.

On the first principal surface (outer surface) of the N layer 21 between a P layer 22 and its adjacent P layer 22, a gate insulating film 24 and a gate electrode 25 are formed to straddle or overlap adjacent P layers 22 and the N+ source layers 23. On the periphery of the gate insulating film 24 and gate electrode 25, an insulating film 26 is arranged. On the P layer 22, N+ source layer 23 and insulating film 26, the source electrode 27 is arranged.

On the first principal surface (outer surface) of the source electrode 27, the joining layer 9b for joining the source electrode 27 and the structural part 5a of the connector 5 with each other is arranged. On the first principal surface (outer surface) of the joining layer 9b, the structural part 5a of the connector 5 having plural holes 11 extending therethrough is positioned.

The connector 5 has a thickness T1. Each of the holes 11 has a width W1. The spacing between the adjacent holes 11, 11 has a width W2. During the attachment of the connector 5 to the semiconductor device 2, the joining layer flows into the holes 11 in the connector. The joining layer 9b extends inwardly of the holes 11 in the connecter 5 by a distance or height of H1. Here, height H1 may be up to half the thickness T1 of the connector 5.

On the first principal surface (outer surface) of the structural part 5a of connector 5 and the joining layer 9b, a sealant 7 is arranged to cover the structural part 5a of the connector 5 and the joining layer 9b.

As shown in FIG. 4A, for the semiconductor device 80 in this embodiment, each of the holes 11 has a quadrangle shape as seen from the outer surface (the cross-section has a generally square shape). As the holes 11 are formed in a quadrangle shape, the shape is similar to that of the semiconductor chip 2, so that the e internal stress of the semiconductor device 80 with respect to rotational movement of the connector 5 with respect to the chip 2 is improved.

As shown in FIG. 4B, the holes 11 may also have a round shape or profile (the cross-section has a cylindrical shape). In this case, there is an advantage that the resistance when the solder is melted during the assembly operation for the semiconductor device 80 may be decreased, and voids generated in the joining layer 9b may be reduced. Also, the holes 11 may have an elliptic shape as seen from the outer surface (the cross-section has an elliptic shape).

Here, to reduce the internal stress in the joining layer 9b and on the semiconductor chip 2, it is preferred that the central portion of the hole forming region 8 be aligned with the central portion of the structural part 5a of the connector 5 in contact with the semiconductor chip 2. When plural holes 11 are arranged, it is preferred that they be arranged in a left/right symmetric configuration around the center or centerline of the structural part 5a of the connector 5. Either plural holes 11 as shown in FIGS. 2 to 4, or a single hole may be provided. It is preferred that the area of the holes 11 is 3% or more of the area of the structural part 5a of the connector 5 in contact with the semiconductor chip 2 and smaller than the area that would lead to influence on the ON resistance (Ron) of the semiconductor device 80.

Figure 6:
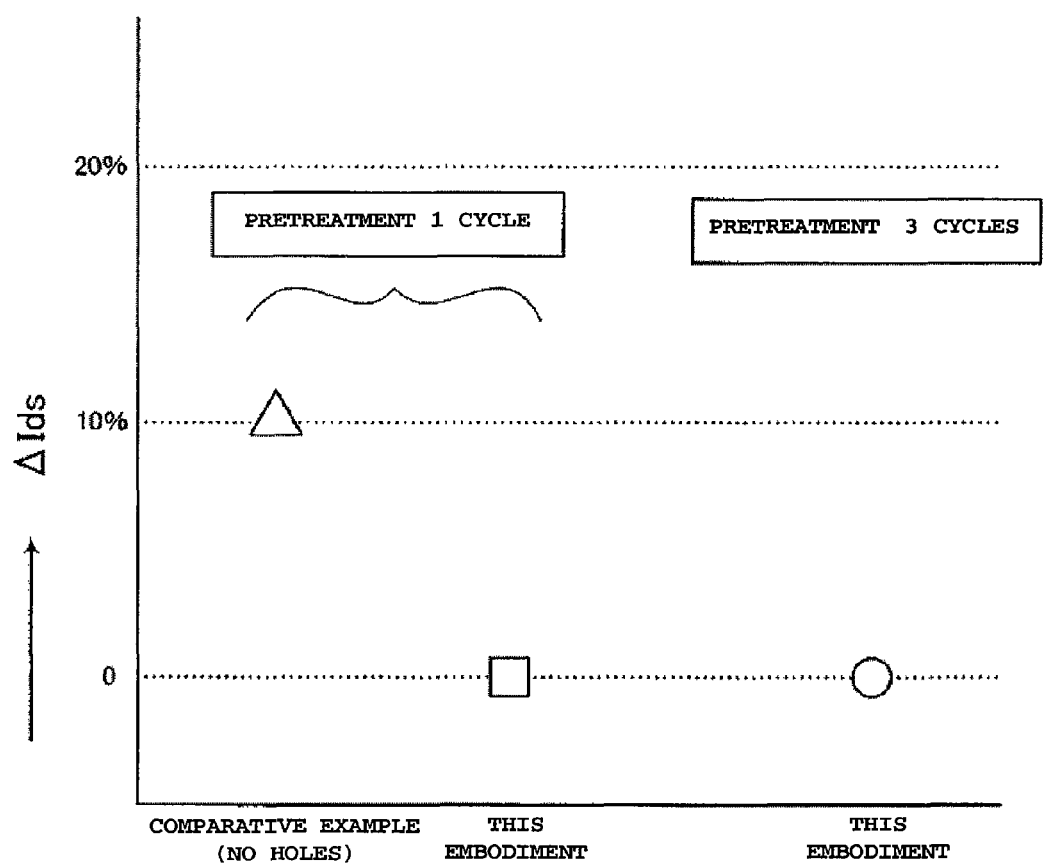
FIG. 6 is a diagram illustrating variation in ΔIds due to the pretreatment in the first embodiment.
Figure 7:
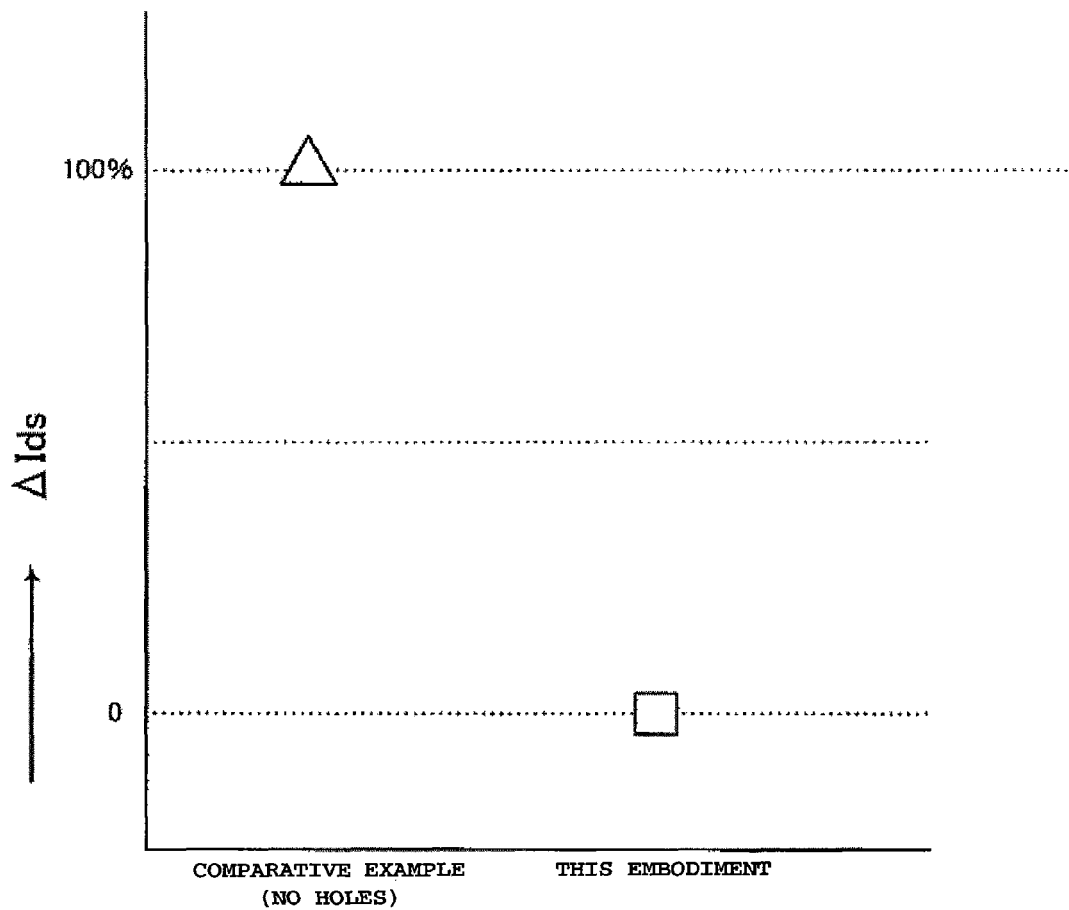
FIG. 7 is a diagram illustrating variation in ΔIds in the TCT test by the pretreatment in the first embodiment.

In the following, the reliability of the semiconductor device will be explained with reference to FIGS. 5 to 7. FIG. 5 is a diagram illustrating the stress applied on the electrode. FIG. 6 is a diagram illustrating variation in the ΔIds due to pretreatment. FIG. 7 is a diagram illustrating variation in the ΔIds in a TCT test.

As shown in FIG. 5, when compared with the semiconductor device in the comparative example without a hole formed region 8, for the semiconductor device 80 of this embodiment having the hole formed region 8, it is possible to decrease the internal stress in the semiconductor chip 2 by 28% by the use of holes 11. In part, by having the holes 11 in the connecting part 5a of the connector 5, the transfer of the expansion and contraction of the connector 5 to the underlying semiconductor chip is reduced because it is taken up in the holes, and the overall rigidity of the connector is reduced.

As shown in FIG. 6, for the semiconductor device in the comparative example, due to the pretreatment executed before the TCT test (thermal cycling test), the ΔIds (variation in the drain current flowing between the drain and the source) varies. On the other hand, for the semiconductor device 80 of this embodiment, such variation in the ΔIds can be significantly suppressed.

More specifically, for the semiconductor device in the comparative example, in one cycle of the pretreatment, there is a variation of 10% in the ΔIds. On the other hand, for the semiconductor device 80 of this embodiment, there is little variation in the ΔIds (about 0%). Even when three cycles of the pretreatment are carried out, there is still little variation in ΔIds (about 0%) for the semiconductor device 80 of this embodiment.

In one cycle of the pretreatment, the sample is set in an environment at 85° C./85% RH for 168 H, followed by reflow treatment at 260° C., and this is repeated in three rounds.

As shown in FIG. 7, after 100 cycles of the TCT test, for the semiconductor device of the comparative example, a change of 100% takes place in the ΔIds. On the other hand, for the semiconductor device 80 of this embodiment, as the hole formed region 8 having holes 11 arranged there is set in the structural part 5a of the connector 5 so that it can relax the internal stress, there is little variation in the ΔIds (about 0%).

As explained above, in the semiconductor device of this embodiment, the following parts are arranged: electrode terminal 1, semiconductor chip 2, source electrode terminal 3, gate electrode terminal 4, connector 5, connector 6, and sealant 7. Here, the electrode terminal 1, semiconductor chip 2, source electrode terminal 3, gate electrode terminal 4, connector 5, and connector 6 are sealed by the sealant 7. In the structural part 5a of the connector 5 on the semiconductor chip 2, a hole formed region 8 having plural holes 11 at the central portion is arranged.

Consequently, the internal stress generated in the semiconductor device 80 can be significantly decreased. Also, by providing the holes 11, it is easy to exhaust the volatile ingredients of the solder flux through the holes 11 during the soldering of the connector 5 to the semiconductor chip 80, so that generation of the solder voids can be significantly suppressed. In addition, by arranging the holes 11, it is possible to significantly decrease the dispersion in the thickness of the solder layer, deviation in the position of the connector 5, etc. Consequently, it is possible to improve the reliability of the semiconductor device 80, and it is possible to increase the yield of the assembly operation.

Figure 8:
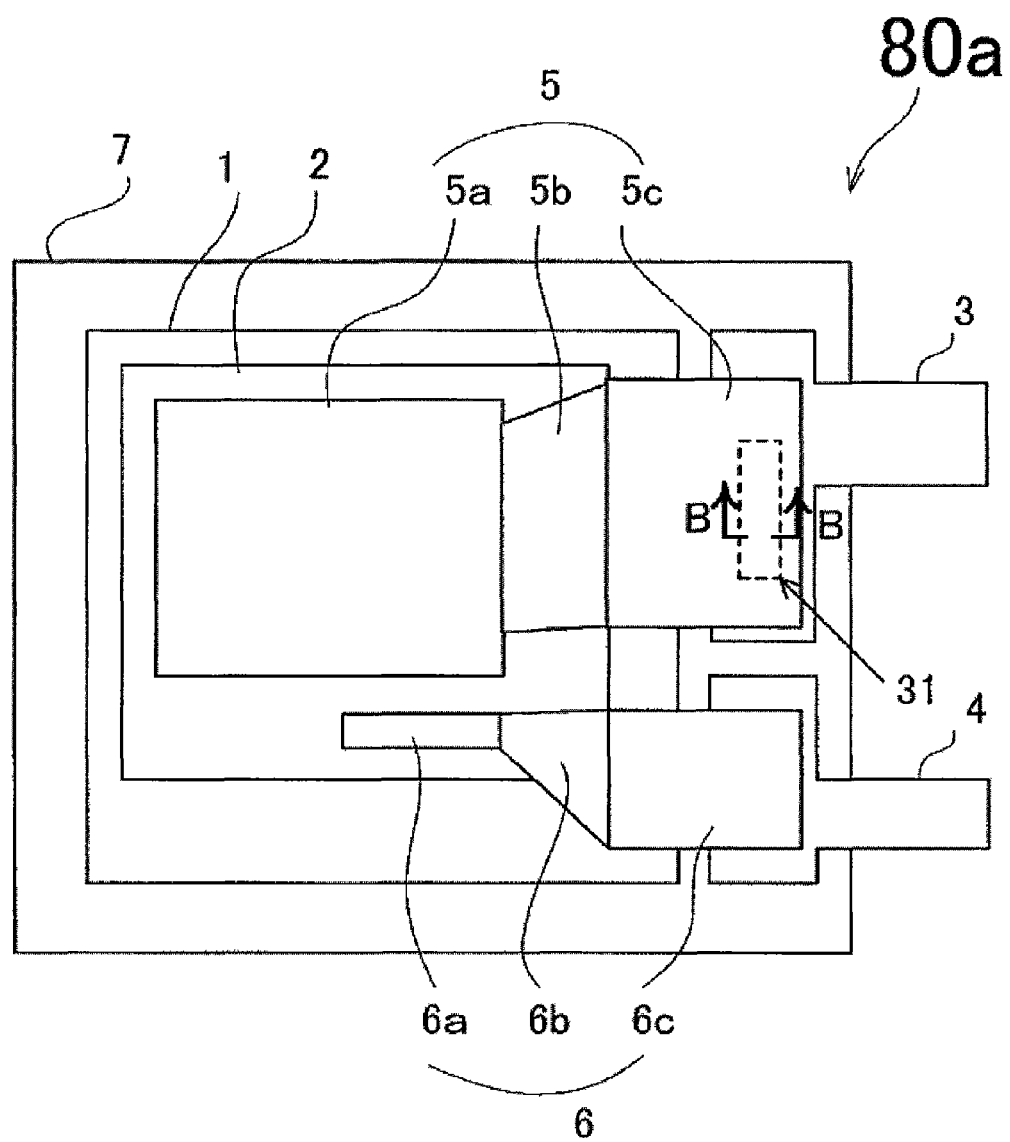
FIG. 8 is a plane view illustrating the semiconductor device in according to a first modified example.
Figure 9:
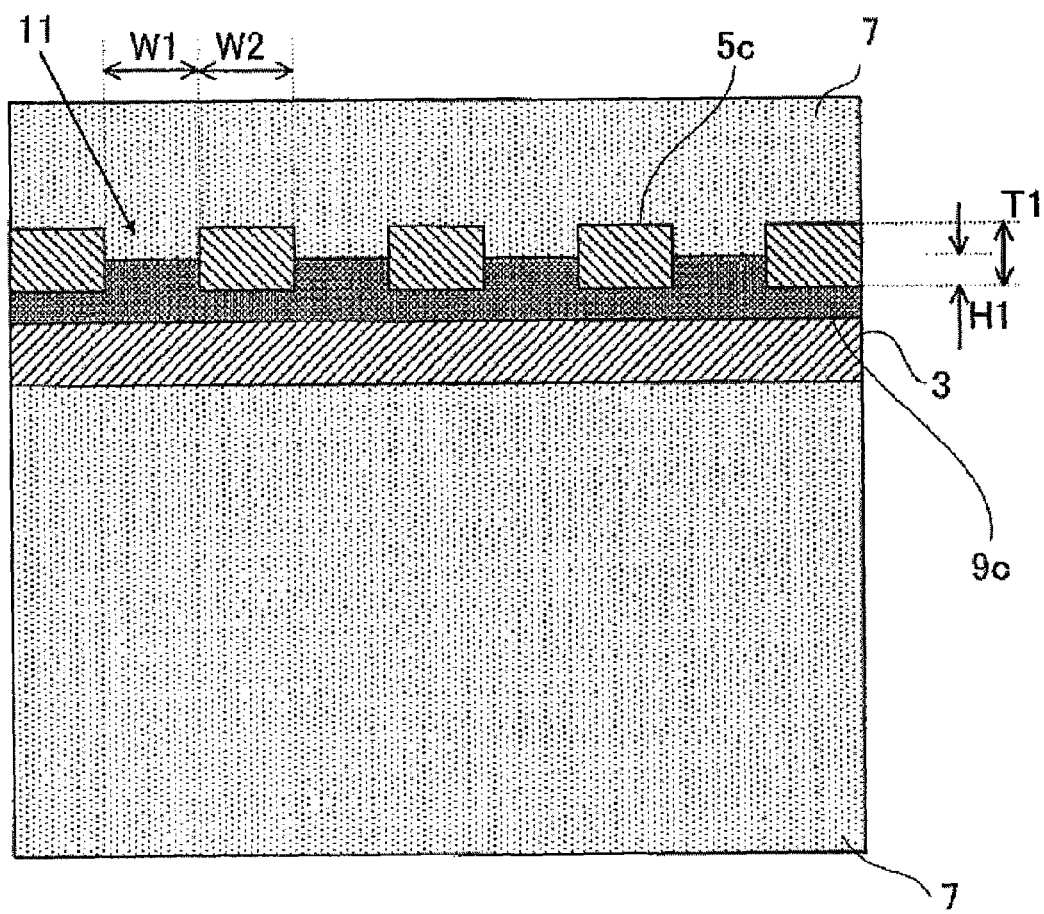
FIG. 9 is a cross-sectional view taken across B-B shown in FIG. 8.

In addition, in this embodiment, through adhesive part 9b holes 11 are arranged on the structural part 5a of the connector 5 formed on the source electrode 27 of the semiconductor chip 2. However, as with the semiconductor device 80a in Modified Example 1 shown in FIG. 8 and FIG. 9, one may also adopt a scheme in which holes 11 are formed on the structural part 5c of the connector 5 arranged on the source electrode terminal 3 as the source electrode terminal via the joining layer 9c. More specifically, as shown in FIG. 8, a hole formed region 31 is arranged in the central portion of the structural part 5c as the region where the source electrode terminal 3 and the structural part 5c of connector 5 are in contact with each other. As shown in FIG. 9, the holes 11 are formed with a width of W1, and the structural part 5c between a hole 11 and its adjacent hole 11 is formed with width W2. In the portion of the holes 11, the joining layer 9b is formed from solder that extends to a height of H1 within the holes 11. Here, height H1 may be half the thickness T1 of the connector 5.

In this embodiment, although explanation has been made in the case that it is applied on an IGBT, it nevertheless can also be adopted on other types, such as power MOS transistors, power ICs, power modules, etc.

In this embodiment, holes 11 are formed on the structural part 5a of the connector 5 extending from the source electrode 27. However, holes 11 may also be formed on the structural part 6a of the connector 6 on the source electrode 27.

Embodiment 2

Figure 10:
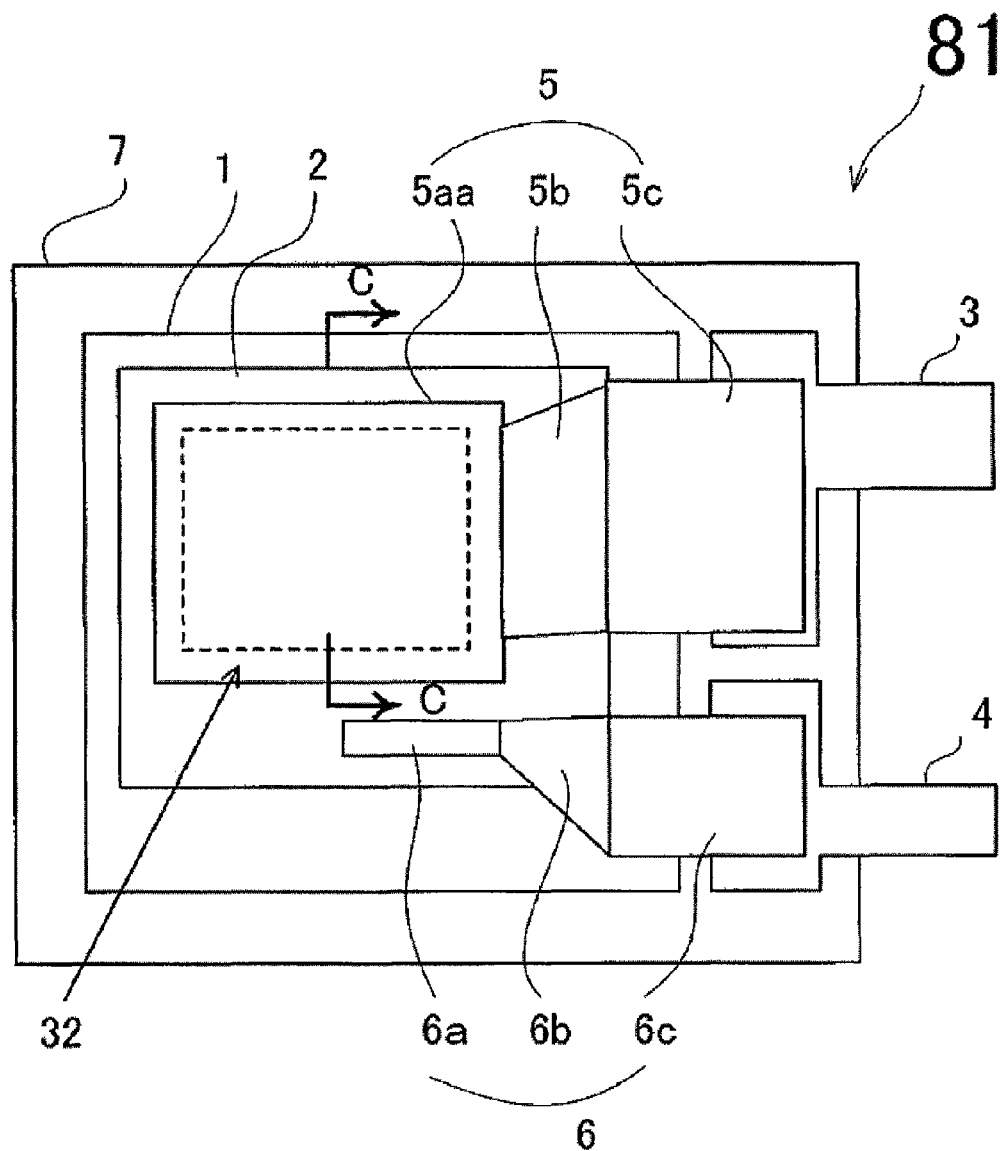
FIG. 10 is a plane view illustrating a semiconductor device according to a second embodiment.
Figure 11:
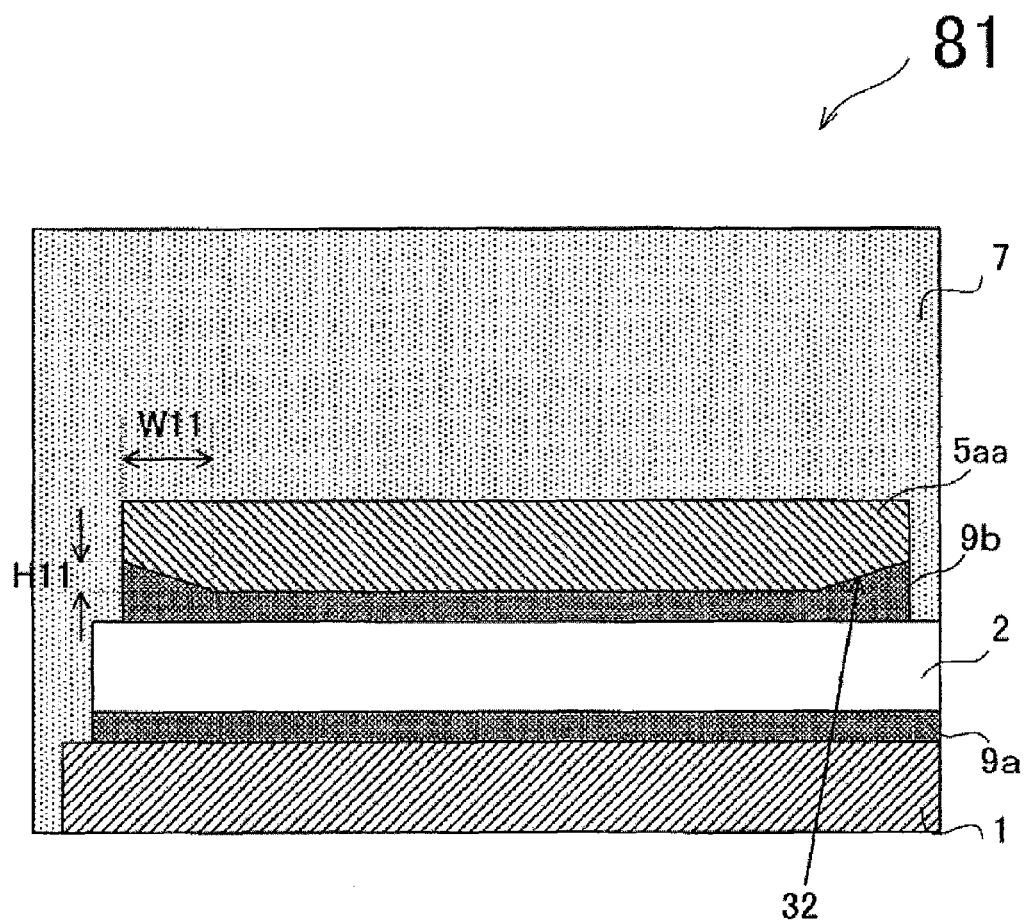
FIG. 11 is a cross-sectional view taken across C-C in FIG. 10.

In the following, the semiconductor device related to Embodiment 2 of the present disclosure will be explained with reference to figures. FIG. 10 is a plane view illustrating the semiconductor device. FIG. 11 is a cross-sectional view taken across C-C in FIG. 10. The thickness of the end portion in contact with the joining layer of the connector on the semiconductor chip is formed in a slope shape that becomes thinner as the position moves outward so as to decrease the internal stress in this embodiment.

The same reference numerals as those in the above in Embodiment 1 are adopted below to represent the same parts, so that they will not be explained in detail again.

As shown in FIG. 10, on the semiconductor device 81, the following parts are arranged: electrode terminal 1, semiconductor chip 2, source electrode terminal 3, gate electrode terminal 4, connector 5, connector 6, and sealant 7. For structural part 5aa of the connector 5 on the semiconductor chip 2, there is a sloped region 32 on the end portion.

Here, the semiconductor device 81 is a semiconductor device that has the semiconductor chip 2 sealed off and has the electrode terminals and the electrodes joined by the connectors. The semiconductor device 81 can be adopted and formed in various fields, such as electric railway system, electric automobiles, inverter field, inductive heating field, etc.

As shown in FIG. 11, for the semiconductor device 81, the end portion of the structural part 5aa (such as the 20% region of the structural part 5aa) of the connector 5 on the semiconductor chip 2 is formed in a slope shape that becomes thinner as the side in contact with the joining layer 9b moves outward (width W11, height H11), i.e., the face of the structural part 5aa facing the semiconductor chip 2 taper way from the chip at the edges of the structural part 5aa. For example, the height H11 of the joining layer 9b connecting the structural part 5aa and the chip 2 is in the range of 20-50 µm at the edges of the connecting part 5aa, but thinner in the region of the connecting part 5aa intermediate of its edges. Here, the thickness becomes thinner linearly. However, one may also set a step, a curve or adopt an R-shape slope.

As the slope forming region 32 is arranged at the ends or edges of the structural part 5aa, it is possible to increase the quantity of the solder at the end portion of the structural part 5aa.

As explained above, for the semiconductor device of this embodiment, the following parts are arranged: electrode terminal 1, semiconductor chip 2, source electrode terminal 3, gate electrode terminal 4, connector 5, connector 6 and sealant 7. Here, on the structural part 5aa of the connector 5 on the semiconductor chip 2, a sloped region 32 is arranged at the end portion.

Consequently, it is possible to increase the thickness of the solder at the end portion of the structural part 5aa of the connector 5 which has been the starting location of cracks, so that it is possible to improve the reliability of the semiconductor device 81. Also, there is no need to significantly increase the solder quantity, so that it is possible to decrease the dispersion in position and inclination of the connector 5, i.e., a thinner joining layer 9b will result in less movement of the connector 5 with respect to the chip 2 during the soldering operation.

Embodiment 3

Figure 12:
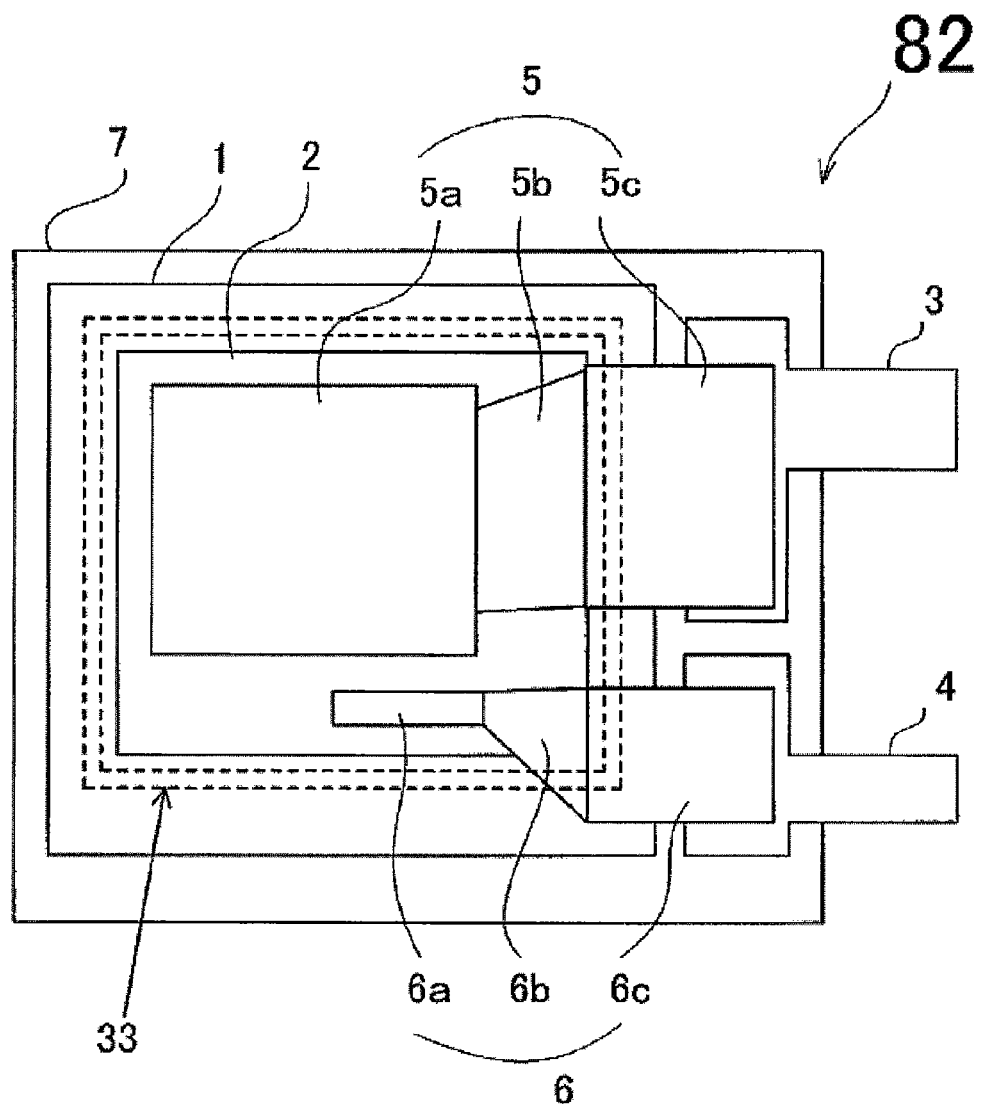
FIG. 12 is a plane view illustrating a semiconductor device according to a third embodiment.

In the following, the semiconductor device related to Embodiment 3 of the present disclosure will be explained with reference to figures. In this embodiment, the underlying substrate includes stress relieving recesses formed therein. FIG. 12 is a plane view illustrating the semiconductor device.

Figure 13:
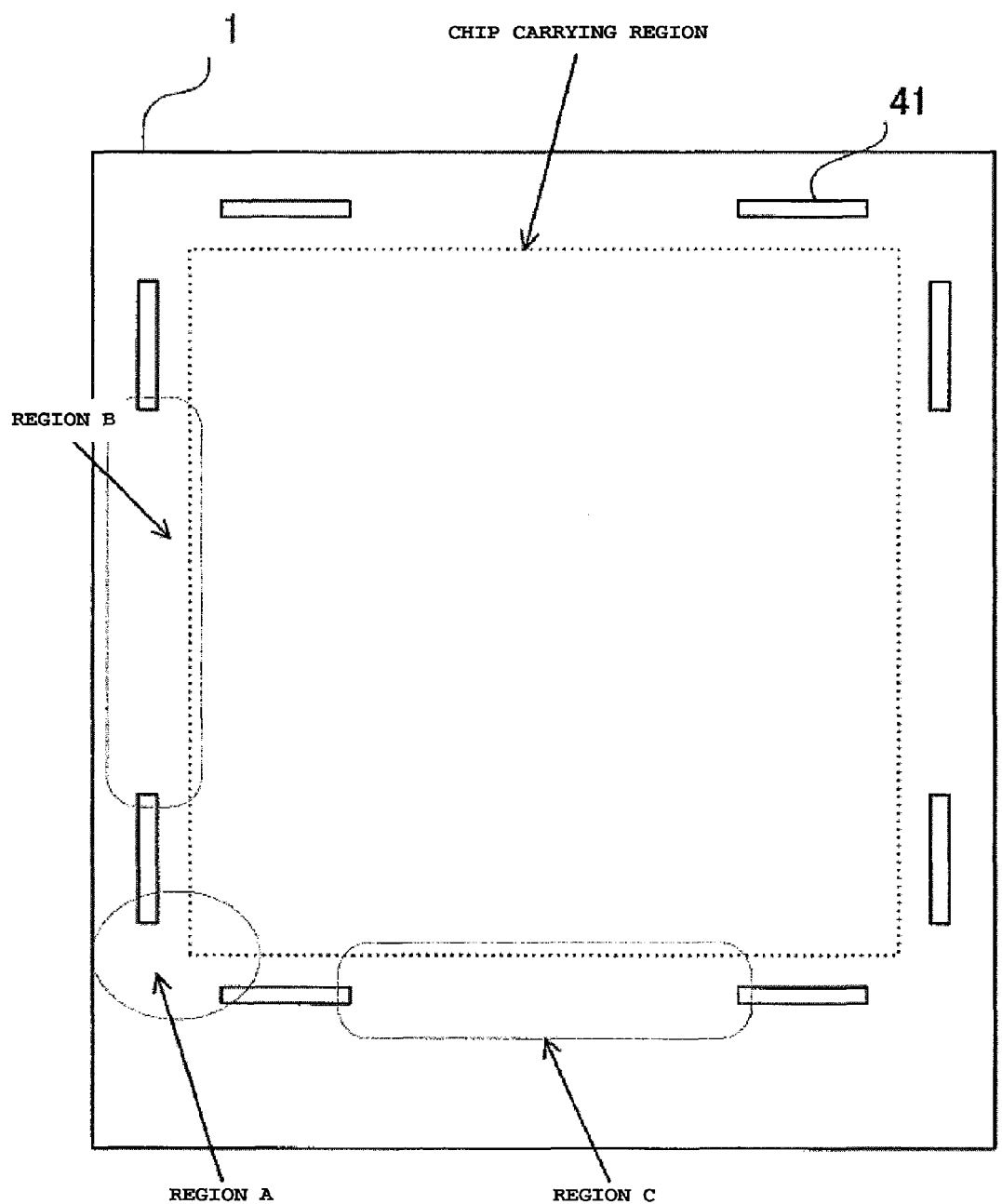
FIG. 13 is a diagram illustrating the configuration of the laser engraving in the third embodiment.
Figure 14:
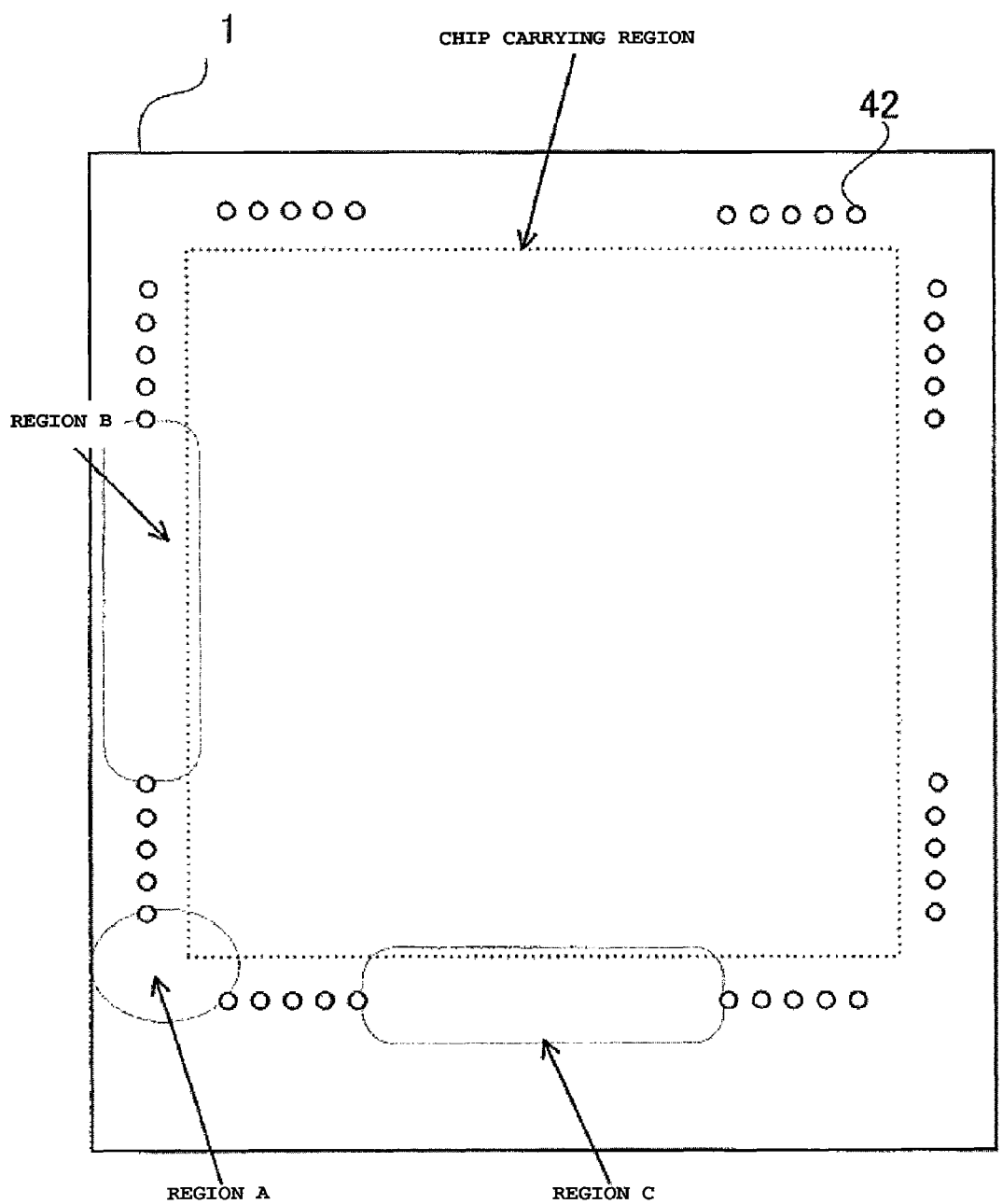
FIG. 14 is a diagram illustrating the configuration of the laser engraving in the third embodiment.

FIG. 13 and FIG. 14 are diagrams illustrating the configuration of the laser cut recesses in the underlying substrate.

The same reference numerals as those in the above in Embodiment 1 are adopted below to represent the same parts, so that they will not be explained in detail again.

As shown in FIG. 12, on the semiconductor device 82, the following parts are arranged: electrode terminal 1, semiconductor chip 2, source electrode terminal 3, gate electrode terminal 4, connector 5, connector 6, and sealant 7. On the first principal surface of the structural part 5a of the connector 5 surrounding the semiconductor chip 2, a laser welding region 33 is arranged.

Here, the semiconductor device 82 is a connector joining type semiconductor device that has the semiconductor chip 2 sealed off and has the electrode terminals and the electrodes joined by connectors. The semiconductor device 82 can be adopted and formed in various fields, such as electric railway system, electric automobiles, inverter field, inductive heating field, etc.

As shown in FIG. 13, a laser engraved region 33 includes plural recessions 41. The recess areas 41 formed under laser irradiation. Here, the recessions 41 are arranged equidistantly with respect to the chip carrying region where the semiconductor chip 2 is carried. The recesses 41 are formed in a striped shape. For example, they may be formed with a length of 300 μm or longer, and with depth in the range of 3-100 μm. The recesses 41 are arranged in the regions outside the following regions: regions A (the corner cut regions), regions B (the regions in the central portion on the left/right edges), and regions C (the regions at the central portions of the upper/lower edges). For example, regions A refer to the range of, e.g., 100 μm from each corner portion of the chip carrying region. Regions B refer to the range of (length of the side surface of the semiconductor chip 2+100)/3 μm. Regions B may be in the range of (length of the upper surface of the semiconductor chip 2+100)/3 μm.

As shown in FIG. 14, the recessed regions 33 may be arranged so that seven recesses 42 in a round shape and set in tandem are arranged at eight sites of the corner portion of the chip carrying region.

As explained above, in the semiconductor device of this embodiment, electrode terminal 1, semiconductor chip 2, source electrode terminal 3, gate electrode terminal 4, connector 5, connector 6, and sealant 7 are arranged. On the first principal surface of the structural part 5a of the connector 5 surrounding the semiconductor chip 2, a laser ablated region 33 is arranged. These laser ablated regions may be precisely located, and used to align the chip 2 to the underlying substrate at a high precision. Also, it is possible to reduce the dispersion in the solder thickness of the joining layer 9b. Consequently, it is possible to improve the assembly yield and reliability of the semiconductor device 82.

Figure 15:
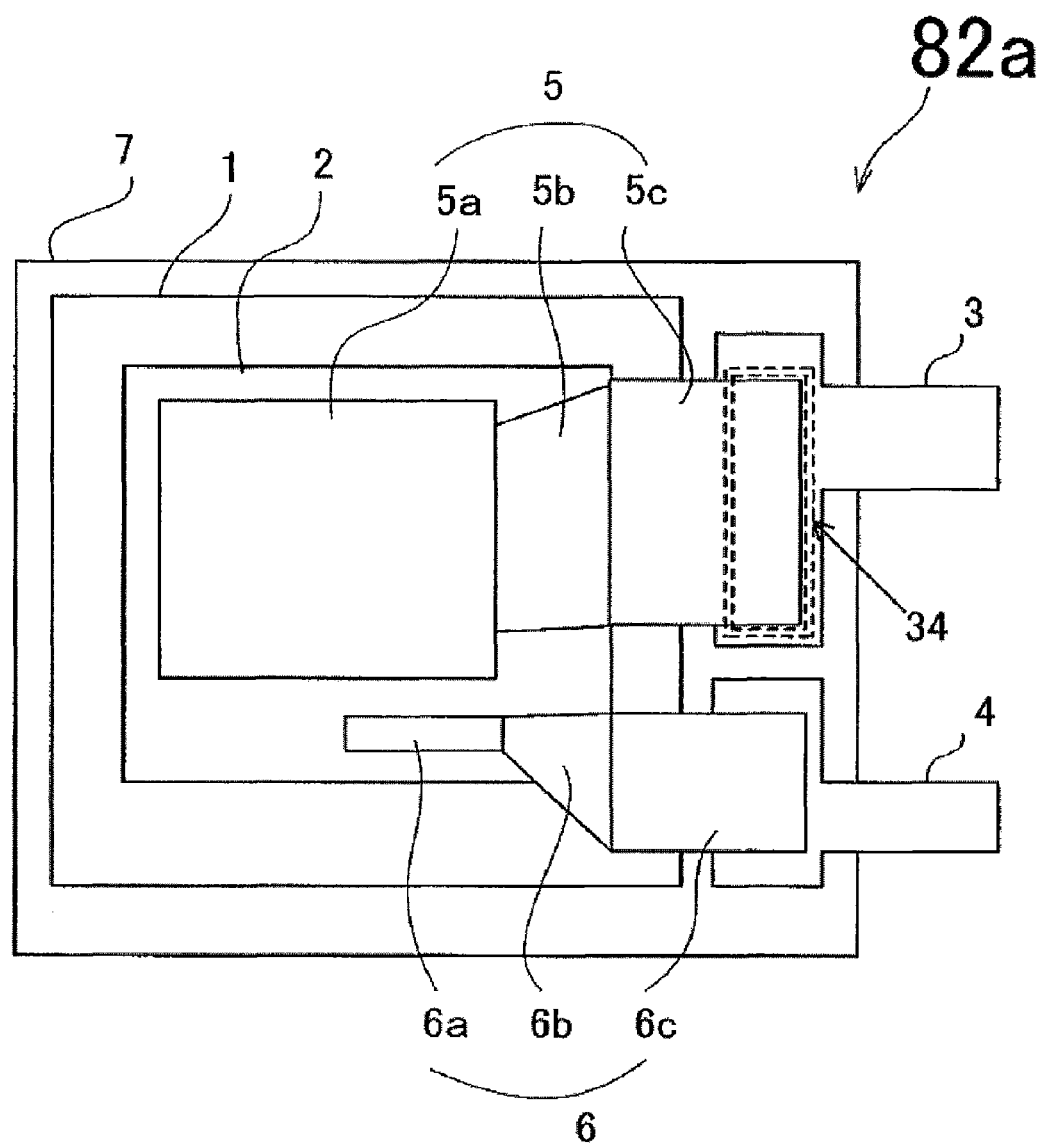
FIG. 15 is a plane view illustrating a semiconductor device according to a second modified example.

In this embodiment, the laser engraved or ablated region is arranged on the drain electrode terminal 1 where the semiconductor chip 2 is carried. However, the present disclosure is not limited to this scheme. For example, as shown in FIG. 15, one may also adopt a scheme in which the laser engraving forming region is arranged on the source electrode terminal 3 as the source electrode terminal of the semiconductor device 82a in Modified Example 2 shown in FIG. 15.

Embodiment 4

Figure 16:
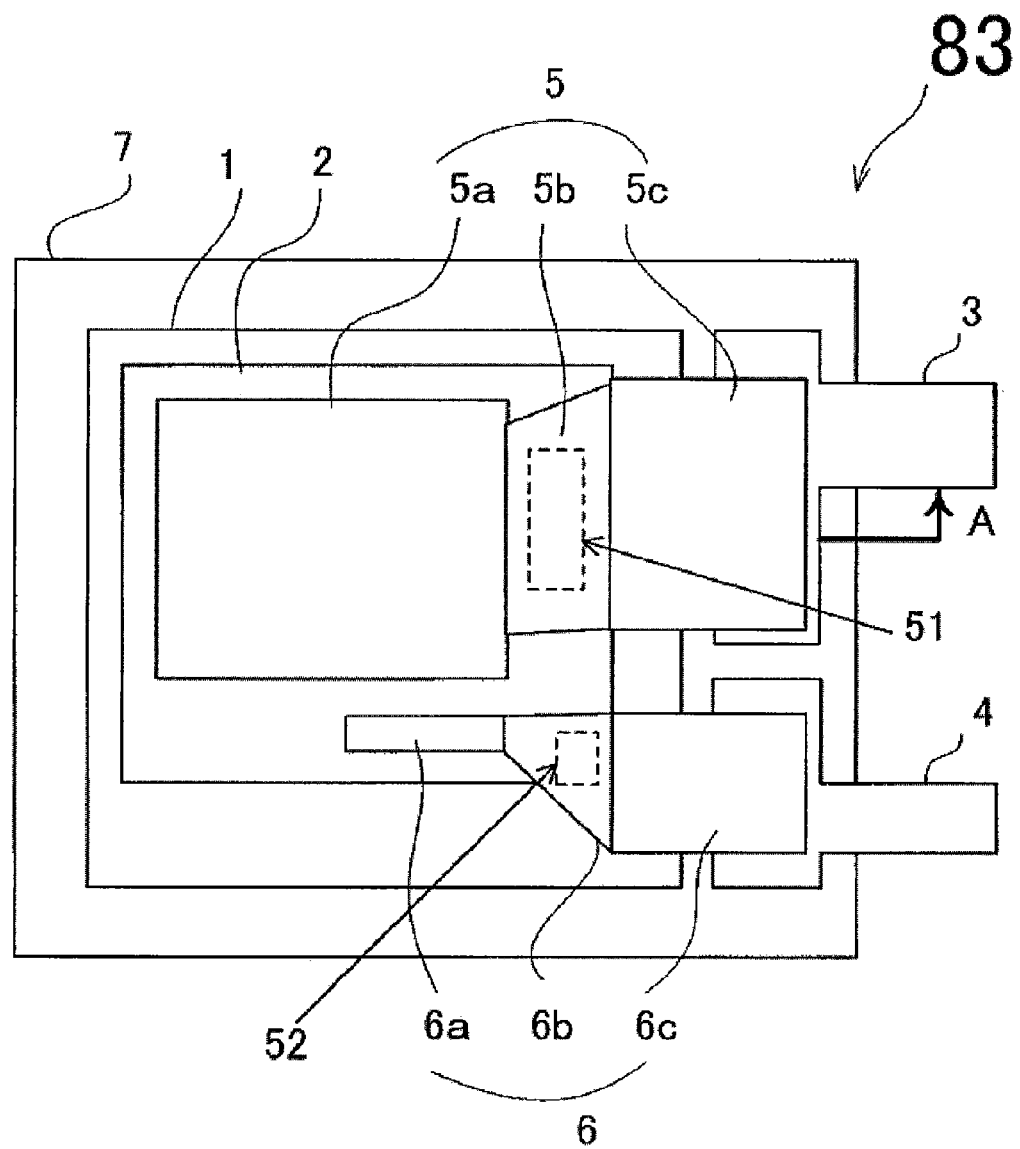
FIG. 16 is a plane view illustrating a semiconductor device according to a fourth embodiment.

In the following, the semiconductor device related to Embodiment 4 of the present disclosure will be explained with reference to figures. FIG. 16 is a plane view illustrating the semiconductor device. A hole formed region is arranged in the connecting portion of the connector in this embodiment.

The same keys as those in the above in Embodiment 1 are adopted below to represent the same parts, so that they will not be explained in detail again.

As shown in FIG. 16, on the semiconductor device 83, the following parts are arranged: electrode terminal 1, semiconductor chip 2, source electrode terminal 3, gate electrode terminal 4, connector 5, connector 6, and sealant 7.

Here, the semiconductor device 83 has the semiconductor chip 2 sealed off and has the electrode terminals and the electrodes joined by the connector. The semiconductor device 83 can be adopted and formed in various fields, such as electric railway system, electric automobiles, inverter field, inductive heating field, etc.

A hole formed region 51 is arranged in the structural part 5b as the connecting part of the connector 5. A hole formed region 52 is arranged on the structural part 6b as the connecting part of the connector 6. In the hole forming region 51 and hole formed region 52, quadrangle shaped or round shaped holes 11 are arranged. Where the hole formed region 51 and hole formed region 52 are arranged, the contact area between the connector 5 and the sealant 7 is increased because the sealant flows into the holes, and the contact area between the connector 6 and the sealant 7 increases.

As explained above, according to the semiconductor device of this embodiment, in the structural part 5b as the connecting part of the connector 5, the hole forming region 51 is arranged, and, in the structural part 6b as the connecting part of the connector 6, the hole forming region 52 is arranged.

Consequently, it is possible to improve the close contact property between the connector 5 as well as the connector 6 and the sealant 7 due to the anchoring effect of the holes. Consequently, it is possible to improve the reliability of the semiconductor device 93.

In Embodiment 1, holes 11 are arranged in the structural part 5a of the connector 5 on the semiconductor chip 2. In Modified Example 1, the holes 11 are arranged in the structural part 5c of the connector 5 on the source electrode terminal 3. In Embodiment 4, holes 11 are arranged in the structural part 5b as the relay portion of the connector 5 and in the structural part 6b as the relay portion of the connector 6. However, the present disclosure is not limited to this scheme. The holes 11 may be formed in at least one of the following parts: structural part 5a of the connector 5 on the semiconductor chip 2, structural part 5c of the connector 5 on the source electrode terminal 3, and the relay portion of the connector (for example, they may be formed on all of the three portions).

In Embodiment 3, the laser engraving is formed on the first principal surface of the drain electrode terminal 1 surrounding the semiconductor chip 2. In Embodiment 2, the laser engraving is arranged on the first principal surface of the source electrode terminal 3 in contact with the structural part 5c of the connector 5. However, the present disclosure is not limited to this scheme. For example, the laser engraving may also be formed on the electrode terminal 1, source electrode terminal 3, and gate electrode terminal 4.

In the embodiments, the present disclosure is adopted on a semiconductor device where the semiconductor chip 2 as IGBT is carried. However, the present disclosure may also be adopted on a semiconductor module that has plural semiconductor chips carried, with semiconductor chips connected with each other by connectors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor chip connected to a first electrode terminal;
a second electrode terminal separated from the first electrode terminal; and
a connector that comprises first through third structural parts, wherein the first structural part is connected to an electrode of the semiconductor chip via a first connecting part thereof; the third structural part is connected to a second electrode terminal via a second connecting part thereof; the second structural part interconnects the first and third structural parts; and a structural non-uniformity is provided on at least one of the first through third structural parts, wherein
the structural non-uniformity comprises a plurality of holes each having a quadrangle, round, or elliptic shape and extending inwardly of a structural part of the connector,
a connecting layer is provided intermediate of the structural parts and the electrode to which the structural part is connected, and the connecting layer extends inwardly of the holes to a distance of up to one half the depth of the holes, and
the structural part has a generally rectangular shape having a surface facing the electrode to which the structural part is joined through the connecting layer, the surface having a center, and the holes are disposed to be generally symmetric about the center.

2. The semiconductor device according to claim 1, wherein the connecting layer is solder.

3. The semiconductor device according to claim 1, wherein the surface of the structural part is tapered at least at an edge thereof.

4. The semiconductor device according to claim 3, wherein the connecting layer has a thicker portion adjacent the edge of the structural part in comparison to a region thereof between opposed edges of the structural part.

5. The semiconductor device according to claim 1, wherein holes are provided in the second structural part.

6. The semiconductor device according to claim 5, wherein a sealing element extends inwardly of the holes in the second structural part.

7. The semiconductor device according to claim 1, wherein the connector electrically connects the semiconductor chip encapsulated in a sealant with a remotely positioned electrode.

8. The semiconductor device according to claim 1, further including a second connector connected to the semiconductor chip and extending therefrom and connected to a second electrode at a position distant from the semiconductor chip.

9. The semiconductor device according to claim 8, wherein the first and second connectors are fully encapsulated within a sealant.

10. The semiconductor device according to claim 1, wherein the first electrode terminal includes at least one recess therein disposed outwardly of the position of the semiconductor chip thereon.

11. The semiconductor device according to claim 10, wherein the at least one recess is formed by laser ablation.

12. A semiconductor device comprising:
a semiconductor chip connected to a first electrode terminal;
a second electrode terminal separated from the first electrode terminal; and
a connector that comprises first through third structural parts, wherein the first structural part is connected to an electrode of the semiconductor chip via a first connecting part; the third structural part is connected to the second electrode terminal via a second connecting part; and the second structural part connects the first and third structural parts, wherein
recessions are arranged on the second electrode terminal so as to surround the periphery of the portion of the second electrode terminal which is in contact with the third structural part.

13. The semiconductor device of claim 12, wherein the third structural part and the second electrode are joined by solder.

* * * * *